United States Patent
Takahashi

(10) Patent No.: US 9,621,167 B2
(45) Date of Patent: Apr. 11, 2017

(54) LOGIC CIRCUIT AND METHOD FOR CONTROLLING A SETTING CIRCUIT

(71) Applicant: NEC Corporation, Tokyo (JP)

(72) Inventor: Tsugio Takahashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/017,435

(22) Filed: Feb. 5, 2016

(65) Prior Publication Data

US 2016/0315618 A1  Oct. 27, 2016

(30) Foreign Application Priority Data

Apr. 21, 2015  (JP) .................................. 2015-086887

(51) Int. Cl.
| | |
|---|---|
| H03K 19/173 | (2006.01) |
| H03K 19/177 | (2006.01) |
| H03K 3/037 | (2006.01) |
| H03L 7/08 | (2006.01) |
| H03K 19/003 | (2006.01) |

(52) U.S. Cl.
CPC ....... H03K 19/17716 (2013.01); H03K 3/037 (2013.01); H03K 19/0033 (2013.01); H03K 19/1776 (2013.01); H03L 7/08 (2013.01)

(58) Field of Classification Search
CPC ..................... H03K 19/1776; H03K 19/17716
USPC ................................................ 326/37–41, 47
See application file for complete search history.

(56) References Cited

U.S. PATENT DOCUMENTS

| | | | | |
|---|---|---|---|---|
| 5,959,930 A | * | 9/1999 | Sakurai ................ | G11C 7/1072 365/230.03 |
| 6,087,851 A | * | 7/2000 | Kim .................. | H03K 19/01758 326/37 |
| 6,473,828 B1 | * | 10/2002 | Matsui ................ | G06F 12/0893 365/154 |
| 2004/0008064 A1 | * | 1/2004 | Kashiwazaki ............ | G06F 1/12 327/158 |
| 2004/0080993 A1 | * | 4/2004 | Takahashi ............ | G11C 7/1045 365/200 |
| 2007/0008810 A1 | * | 1/2007 | Lee ....................... | G11C 7/1045 365/233.5 |

FOREIGN PATENT DOCUMENTS

JP         2014-071576 A     4/2014

* cited by examiner

*Primary Examiner* — Jason M Crawford
(74) *Attorney, Agent, or Firm* — McGinn IP Law Group, PLLC.

(57) ABSTRACT

A logic circuit includes a setting circuit which holds and outputs setting information, a first flip-flop which holds data written to the setting circuit and outputs it in synchronization with an inputted clock, a second flip-flop which holds a write address for selecting the setting circuit and outputs it in synchronization with the inputted clock, and a third flip-flop which holds write enable which allows writing to the setting circuit and outputs it in synchronization with the inputted clock, wherein the setting circuit includes a fourth flip-flop which holds the setting information in synchronization with a given timing signal, and a fifth flip-flop which holds the output of the third flip-flop and outputs a write clock to the fourth flip-flop as the timing signal in synchronization with the inputted clock.

11 Claims, 8 Drawing Sheets

CONFIGURATION DATA

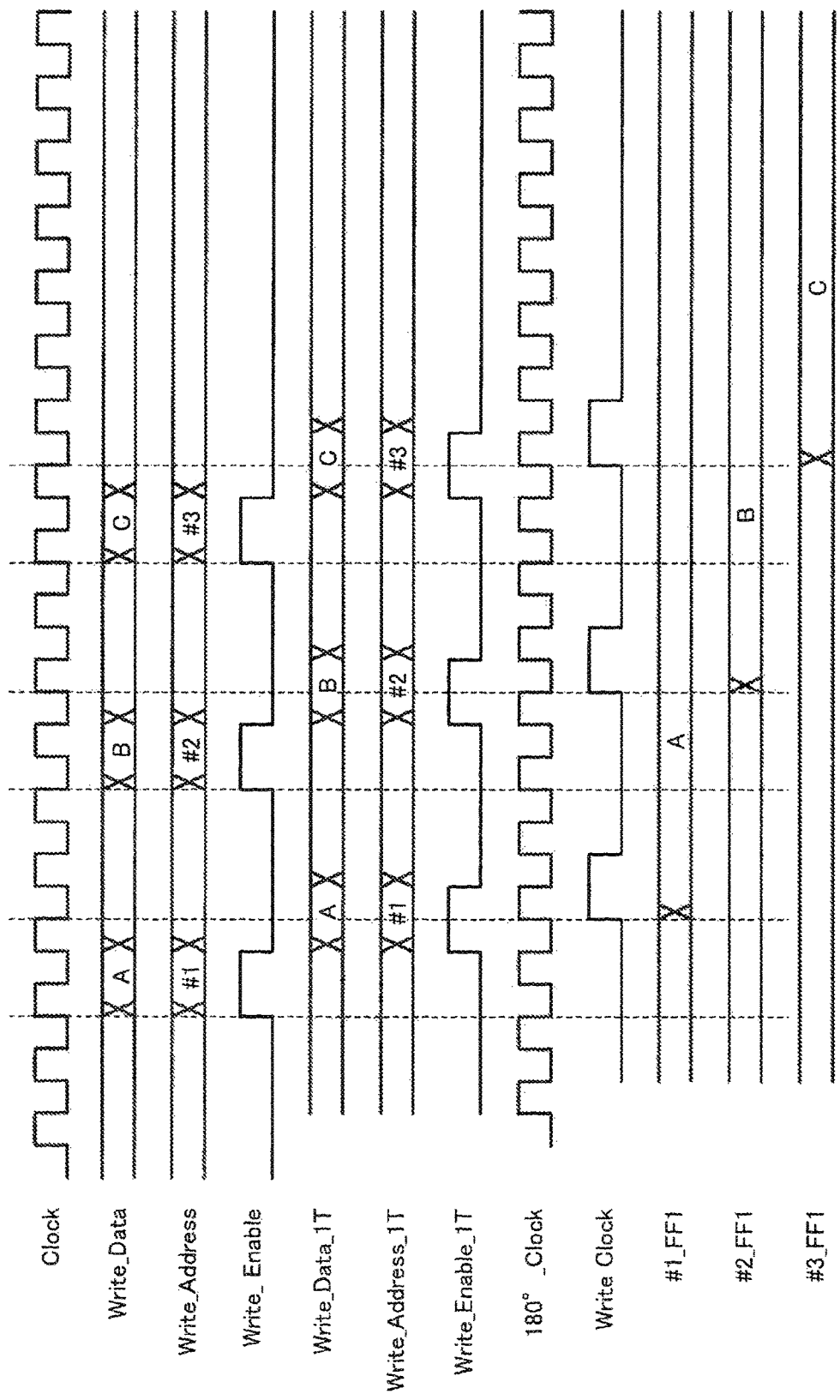

LOGIC CIRCUIT AND METHOD FOR CONTROLLING A SETTING CIRCUIT

INCORPORATION BY REFERENCE

This application is based upon and claims the benefit of priority from Japanese Patent Application No. 2015-86887, filed on Apr. 21, 2015, the disclosure of which is incorporated herein in its entirety by reference.

TECHNICAL FIELD

The present invention relates to a logic circuit and a method for controlling a setting circuit and in particular, relates to a method for controlling a setting circuit which holds setting information.

BACKGROUND ART

An FPGA (Field Programmable Gate Array) is a programmable logic circuit and has a feature in which a user can realize a desired circuit configuration by changing the connection of internal wiring by user programming. The FPGA functions as a predetermined logic circuit by writing configuration data in which a logical relationship between the logic gates and a connection relationship between the logic gates are described in a configuration RAM (Configuration Random Access Memory) included in the FPGA. The connection of internal wiring in the FPGA can be changed by changing a value ("1" or "0") set to the configuration RAM and whereby, the desired circuit can be realized.

By the way, two kinds of errors occur in the configuration RAM. One is a "hard error" caused by a defect in the circuit itself and the other is a "soft error" caused by a radioactive ray such as an alpha ray or the like which corrupts the data in the configuration RAM. When the "soft error" occurs, it can be recovered by reconfiguring the FPGA. Reconfiguration is achieved by reloading the configuration data to the configuration RAM (refer to Patent Literature 1).

CITATION LIST

Patent Literature

[Patent Literature 1] Japanese Patent Application Laid-Open No. 2014-71576

SUMMARY

It is assumed a case in which the soft error occurs in the configuration RAM, the error occurring in the configuration RAM is corrected by a self-control error correction function of the FPGA, and the error is recovered. It has been strongly desired to realize a function in which a setting value initially set to a flip-flop which holds the setting value as the setting information is held even when the error occurring in the configuration RAM is corrected.

An object of the present invention is to provide a logic circuit in which a flip-flop can keep a setting value that is initially set as the hold value without increasing a circuit scale and a method for controlling a setting circuit.

Means for Solving the Problem

In order to achieve the above-mentioned object, a logic circuit according to the present invention includes a setting circuit which holds and outputs setting information, a first flip-flop which holds data written to the setting circuit and outputs it in synchronization with an inputted clock, a second flip-flop which holds a write address for selecting the setting circuit and outputs it in synchronization with the inputted clock, and a third flip-flop which holds write enable which allows writing to the setting circuit and outputs it in synchronization with the inputted clock, wherein the setting circuit includes a fourth flip-flop which holds the setting information in synchronization with a given timing signal, a selector which gives one of the output of the fourth flip-flop and the output of the first flip-flop to an input of the fourth flip-flop, and a gate circuit which controls a selection state of the selector on the basis of the output of the second flip-flop and the output of the third flip-flop and the setting circuit further includes a fifth flip-flop which holds the output of the third flip-flop and outputs a write clock to the fourth flip-flop as the timing signal in synchronization with the inputted clock.

A method for controlling a setting circuit according to the present invention is a method for controlling the setting circuit which holds setting information in which only when a write enable signal is valid and a write address signal is valid, writing to the setting circuit is enabled.

Advantageous Effect of the Invention

By using the present invention, a flip-flop can keep a setting value that is initially set to the flip-flop as a hold value without increasing a circuit scale.

BRIEF DESCRIPTION OF THE DRAWINGS

Exemplary features and advantages of the present invention will become apparent from the following detailed description when taken with the accompanying drawings in which:

FIG. 8 is a time chart for explaining operation of a logic circuit shown in FIG. 7.

EXEMPLARY EMBODIMENT

Figure 1:
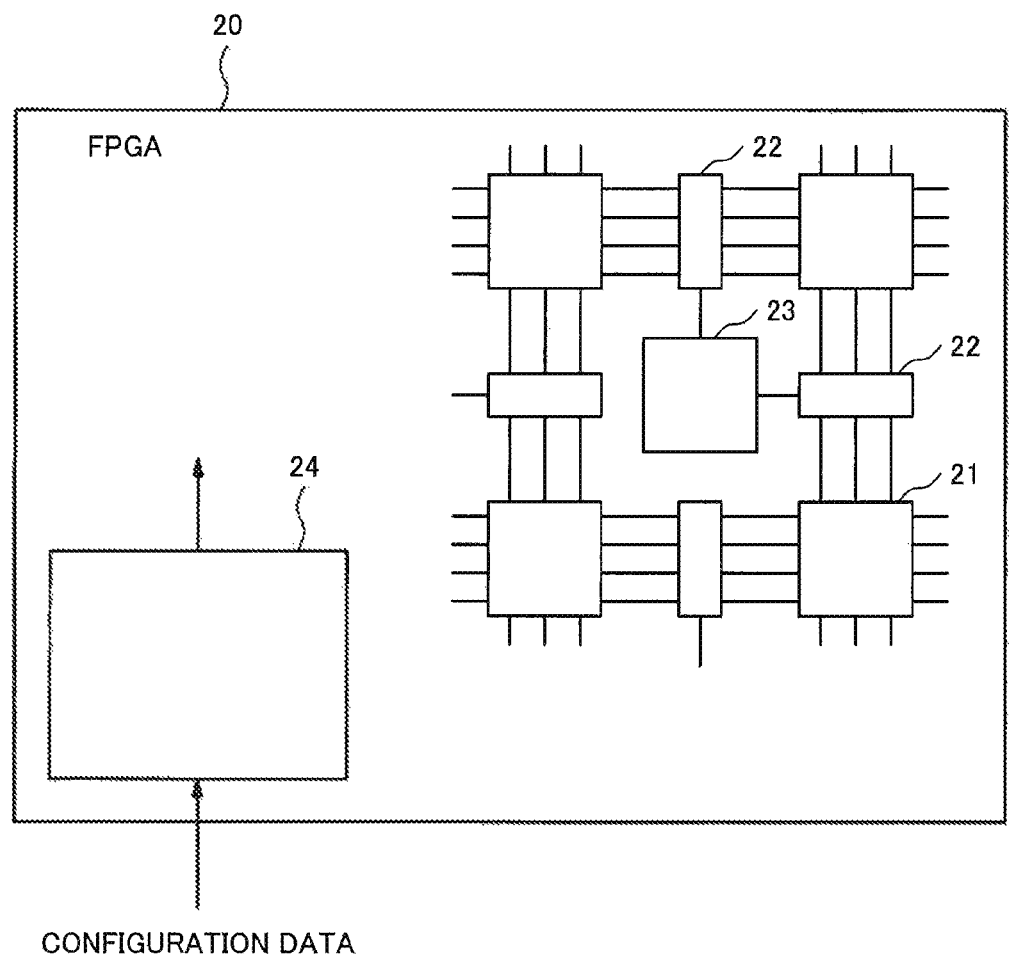
FIG. 1 is a schematic illustration showing a configuration of an FPGA.

A preferred exemplary embodiment of the present invention will be described in detail with reference to the drawing. FIG. 1 is a schematic illustration showing a configuration of an FPGA. An FPGA 20 includes a switch matrix section 21, a wiring section 22 composed of vertical wirings and horizontal wirings, a PLD (Programmable Logic Device) section 23, a configuration RAM 24, and the like. The switch matrix section 21 determines the connection in the wiring section 22 composed of the vertical wirings and the horizontal wirings. The configuration RAM 24 instructs the switch matrix section 21 to make the connection or not to make the connection. The configuration RAM 24 loads configuration data in which a logical relationship between the logic gates and a connection relationship between the logic gates are described from outside. The PLD section 23 is a programmable logic element and performs for example, a logical operation.

Specifically, the configuration RAM 24 and the switch matrix section 21 of the FPGA 20 are connected to each other at bit level. The connection state (connection or non-connection) of each switch in the switch matrix section 21 is changed according to a value ("0" or "1") of each bit of the configuration RAM 24. As a result, a vertical wiring among the vertical wirings and a horizontal wiring among the horizontal wirings can be arbitrary connected to each other and a desired circuit can be realized.

By the way, even in the configuration RAM of the FPGA, the soft error problem cannot be avoided.

This will be specifically described below. In a large-scale FPGA produced by the latest 20-nm process, the number of bits of the configuration RAM is approximately 300 Mbits. A soft error rate per Mbit is approximately 33 FIT/Mbit. In this case, the soft error rate of the configuration RAM can be calculated as follows: 300 Mbits×33 FIT/Mbit=approximately 10,000 FIT. Where, FIT is a unit for expressing an expected failure rate; one FIT is equal to one failure per $10^9$ hours (1,000,000,000 hours) of device operation. Further, in the FPGA, a lot of lines are provided in vertical wiring/horizontal wiring area for the ease of wiring connection. When assuming that the number of the vertical wiring lines is n and the number of the horizontal wiring lines is m, the number of the intersection points of a switch matrix is equal to n×m. Therefore, the number of bits of the configuration RAM has to be equal to n×m.

The guidelines in the information provided by an FPGA manufacturer shows that the number of the intersection points that are actually used in the switch matrix section is about 1/10 of the total number of the intersection points mounted therein even when almost whole area of the usable area of the FPGA is used.

In other words, the guidelines shows that the actual soft error rate of the configuration RAM is 1,000 FIT that is 1/10 of the above-mentioned value. As a result, the soft error rate of the large-scale FPGA produced by the latest process is approximately 1,000 FIT that is a value with 3 digits.

When it is assumed that one thousand devices are shipped every year and ten thousand devices are used in total in 10 years, average years of operation for the devices is 5 (=10/2) years and the total operating hours for all the devices is 4.38E(+8) (=10,000 devices×5 years×365 days×24 hours) hours. Accordingly, the expected number of failures due to soft error is 438 (=1,000 E(−9)×4.38 E(+8)) and it is expected that the failure due to soft error occurs in approximately 438 devices in 10 years.

Up to now, as for a communication apparatus, in preparation for unexpected failure, in many cases, a communication system is usually designed so that the communication system has redundancy and whereby, when one of the communication apparatuses fails, it is relieved by the other. However, in a device for which it is expected that the percentage of the devices that will fail during a life period is approximately 5% of the total number of shipped devices, even when the communication system has a redundant configuration and communication quality can be ensured, much cost is required for dealing with the failure and it is difficult to provide good quality at a reasonable cost.

For this reason, in recent years, there are many cases in which a self-control error correction function of the configuration RAM mounted in the FPGA is used. In this case, an FEC (Forward Error Correction) function is added to the configuration RAM of the FPGA. The FEC function always detects an FEC error and corrects an error bit of the configuration RAM by itself when a soft error occurs in the configuration RAM and whereby, the FEC error occurs.

However, it takes a little time until the correction is completed after the configuration RAM is inverted by the soft error and the FEC process is performed. As an example, in the FPGA for the large-scale and high-speed system produced by the 20-nm process, the number of processing elements that perform the FEC process in parallel is increased and whereby, the correction can be completed in about 30 milliseconds (30 msec) (hereinafter, referred to as a correction time).

Therefore, on the assumption that the soft error correction function of the configuration RAM is used for the communication apparatus, two main functions of the communication apparatus are defined as follows. One is a "signal processing section". This signal processing section performs a main function of the communication function and is an aggregation of macros that realizes each basic element for signal processing. The other is a "setting circuit". Generally, the setting circuit stores various setting information through a CPU (Central Processing Unit) port. Each mode and each function of the signal processing section are defined and specified in detail according to this information.

First, soft error correction of the configuration RAM of the signal processing section will be considered. In the signal processing section, a processing result includes an error during an error correction time. However, usually, some sort of data recovery function is provided to the general signal processing circuit and usually, the data is recovered by this function.

Next, the setting circuit will be considered. Generally, each setting value is stored in a flip-flop and when once it is stored, the setting value is held until this setting value is updated. There are many communication apparatuses in which the setting value is not reset during the life of the communication apparatus after the setting value is set once. For example, there are many flip-flops which keep retaining the value that is set ten years ago.

There may be a case such that, when a circuit configuration is changed due to the soft error of the configuration RAM, the setting value retained in the flip-flop is rewritten. In this case, even when the soft error correction (reconfiguration) is performed and the circuit connection is restored, the setting value that is rewritten remains in the flip-flop. As a result, although the error correction of the configuration RAM is completed, the device is still in an error state and cannot be restored.

In conclusion, although the soft error correction function of the configuration RAM can be usefully used in a signal processing system, the soft error correction function of the configuration RAM may not be usefully used in a setting system. As a result, there generates a case such that even when the soft error correction function of the configuration RAM is used, the function of the device is not restored.

Namely, even when the communication apparatus used in both or one of an apparatus supply side and an apparatus use side uses the soft error correction function of the configuration RAM for the purpose of reducing a maintenance cost thereof, a setting cannot be normally performed when the hold value in the setting system is reversed. In such a case, it is determined that a unit fails and the failed unit has to be attended by a maintenance division. As a result, a problem in which the maintenance cost cannot be reduced and the effect of reducing the maintenance cost cannot be sufficiently obtained occurs.

Further, for the use in space or for a special apparatus, a "Triple-Redundancy technology" in which three functional circuit blocks are provided in the apparatus, three results are obtained by three functional circuit blocks, and a result with the highest validity is decided by majority vote is widely used. When the "Triple-Redundancy technology" is used, a size of the circuit becomes three or more times and the cost increases. For these reasons, the "Triple-Redundancy technology" is not applied to a general apparatus. Further, there are many cases in which the "Triple-Redundancy technology" is applied to only the special important circuit. However, in this case, when a unit to which the "Triple-Redundancy technology" is not applied fails, this failed unit has to be replaced. Therefore, the effect of the maintenance cost reduction is limited.

The present invention provides a logic circuit in which the flip-flop can keep the setting value that is initially set as the hold value, without increasing a circuit scale unlike a case in which the "Triple-Redundancy technology" is applied, and provides a method for controlling a setting circuit.

Figure 2:
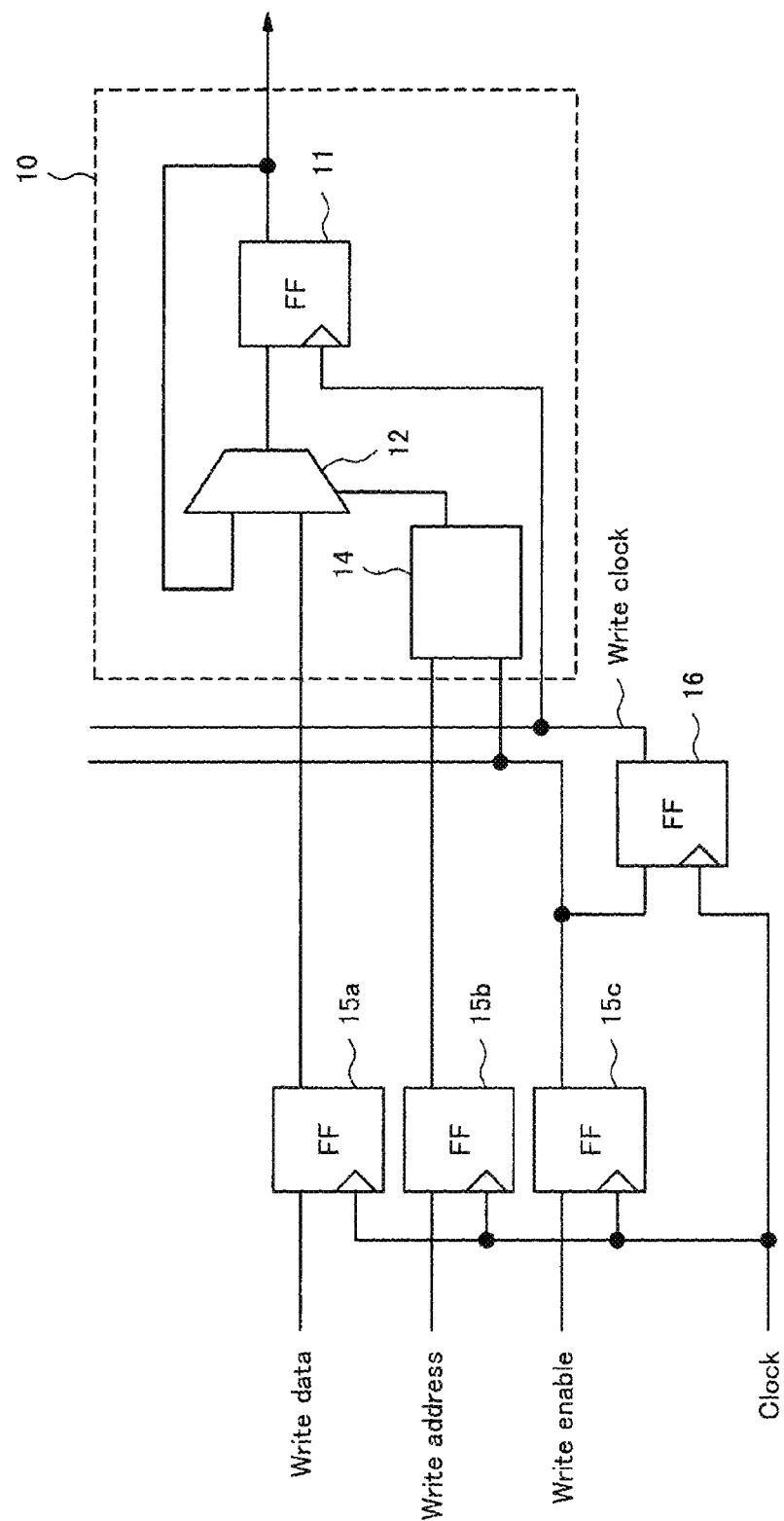
FIG. 2 is a block diagram showing a logic circuit based on the upper level concept of the present invention.

A logic circuit based on the upper level concept of the present invention will be described before describing a specific exemplary embodiment. FIG. 2 is a block diagram showing the logic circuit based on the upper level concept of the present invention.

The logic circuit shown in FIG. 2 includes a setting circuit 10, a first flip-flop 15a, a second flip-flop 15b, a third flip-flop 15c, and a fifth flip-flop 16. The setting circuit 10 includes a fourth flip-flop 11, a selector 12, and a gate circuit 14.

The setting circuit 10 holds the setting information and outputs it. The first flip-flop 15a holds data written to the setting circuit 10 and outputs it in synchronization with an inputted clock. The second flip-flop 15b holds a write address for selecting the setting circuit 10 and outputs it in synchronization with the inputted clock. The third flip-flop 15c holds write enable which allows writing to the setting circuit 10, delays it by one clock period (1T), and outputs it in synchronization with the inputted clock.

The fourth flip-flop 11 of the setting circuit 10 holds the setting information in synchronization with the given timing signal. The selector 12 of the setting circuit 10 gives one of the output of the fourth flip-flop 11 and the output of the first flip-flop 15a to the input of the fourth flip-flop 11. The gate circuit 14 controls a selection state of the selector 12 on the basis of the output of the second flip-flop 15b and the output of the third flip-flop 15c.

The fifth flip-flop 16 holds the output of the third flip-flop 15c and outputs a write clock to the fourth flip-flop 11 of the setting circuit 10 as the timing signal in synchronization with the inputted clock.

In the logic circuit shown in FIG. 2, only when write enable is valid, the write clock signal outputted by the fifth flip-flop 16 has a rising edge. For this reason, when write enable is invalid, the write clock is kept to a fixed value. Even when the circuit configuration of a peripheral circuit of the fourth flip-flop 11 of the setting circuit 10 is changed due to the soft error of the configuration RAM, a new value cannot be written to the flip-flop 11 when write enable is not valid. Accordingly, the hold value of the flip-flop 11 does not change. An exemplary embodiment will be described in detail below.

[First Exemplary Embodiment]

Figure 3:
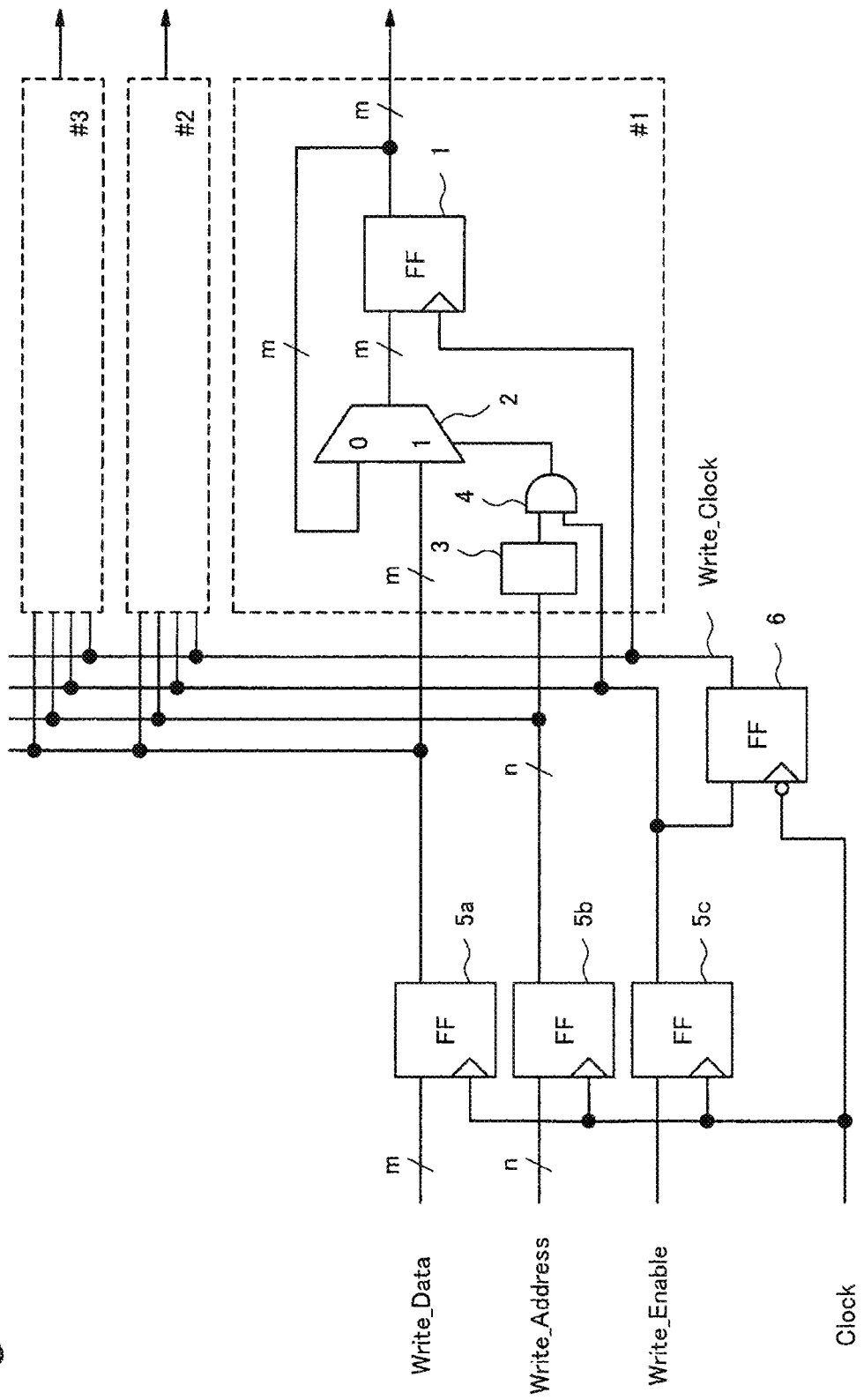
FIG. 3 is a block diagram showing a logic circuit according to a first exemplary embodiment of the present invention.
Figure 4:
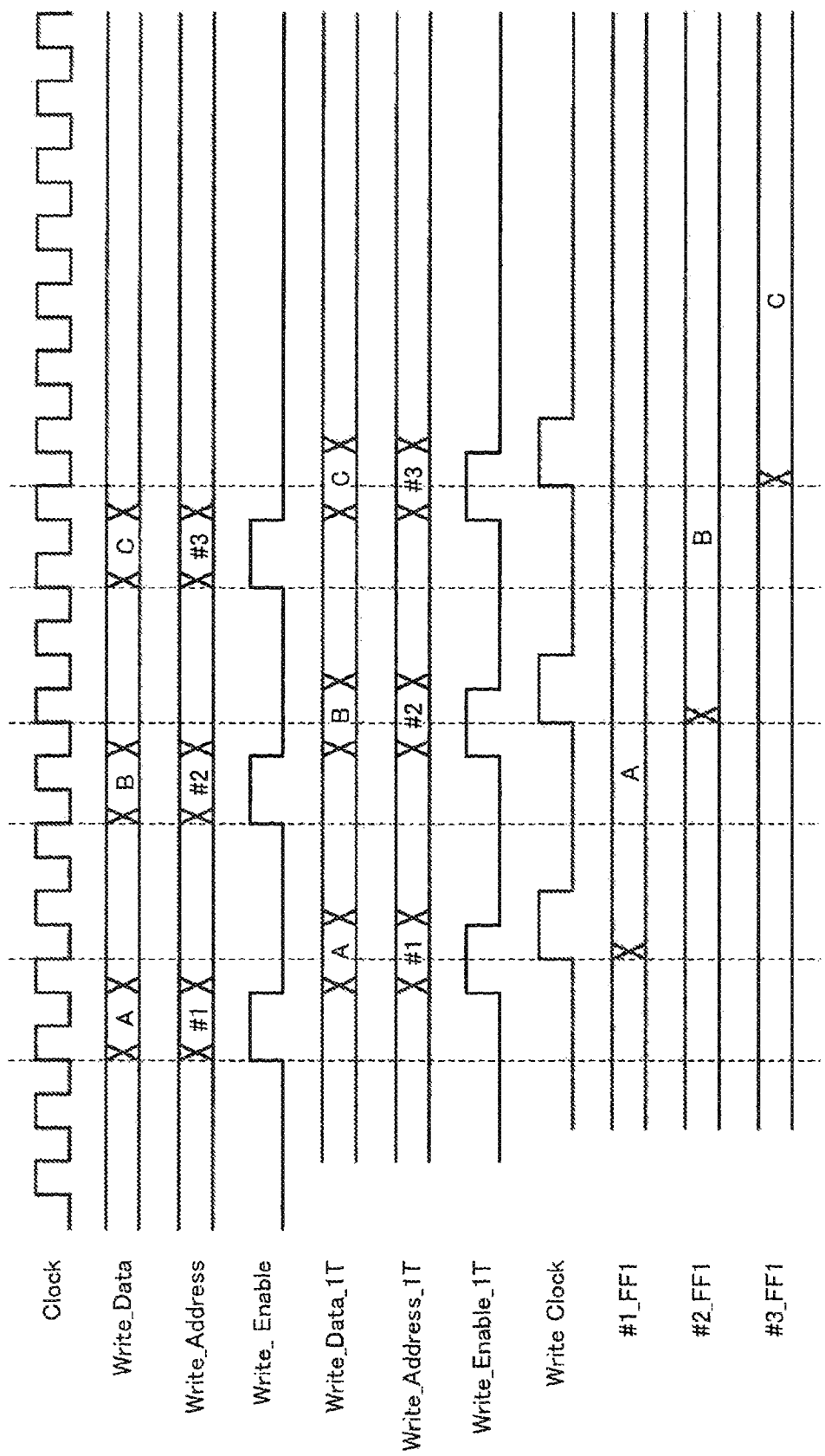
FIG. 4 is a time chart for explaining operation of a logic circuit shown in FIG. 3.

Next, a logic circuit according to a first exemplary embodiment of the present invention will be described. FIG. 3 is a block diagram showing a logic circuit according to the first exemplary embodiment of the present invention. FIG. 4 is a time chart for explaining operation of the logic circuit shown in FIG. 3.

The logic circuit shown in FIG. 3 includes a flip-flop 5a, a flip-flop 5b, a flip-flop 5c, and a flip-flop 6. Further, a setting circuit which holds the setting information includes a flip-flop 1, a selector 2, an n-to-1 decoder 3, and a gate 4. FIG. 3 shows a case, as an example, such that three sets of setting circuits: a setting circuit #1, a setting circuit #2, and a setting circuit #3 are used. However, the number of setting circuits is not limited to three for the present invention. Further, the number of the flip-flops is equal to the number of the kinds of the write addresses (Write_Address).

In FIG. 3, the write data (Write_Data) is composed of m bits and the write address signal (Write_Address) is composed of n bits.

The flip-flop 1 holds the setting value as the setting information.

The flip-flop 5a performs retiming of a write data signal (Write_Data). The flip-flop 5b performs retiming of the write address signal (Write_Address). The flip-flop 5c performs retiming of a write enable signal (Write_Enable). The flip-flop 5c delays this write enable signal (Write_Enable) by one clock period (1T) and outputs it. When the selector 2 writes new Data to the flip-flop 1, the selector 2 reads the write data (Write_Data). The n-to-1 decoder 3 outputs a "high" level signal only when the Write_Address is valid (for example, an Address value of the setting circuit #1). The gate 4 outputs a "high" level signal when the decoder 3 outputs a "High" level signal and the output (Write_Enable_1T) of the flip-flop 5c is valid.

In this exemplary embodiment, a positive phase Clock is supplied to the flip-flop 5a, the flip-flop 5b, and the flip-flop 5c and a reverse phase clock is supplied to a flip-flop 6. In other word, an in-phase Clock is supplied to the flip-flop 5a, the flip-flop 5b, and the flip-flop 5c, and a reverse phase clock is supplied to a flip-flop 6.

The flip-flop 6 performs retiming of the output of the flip-flop 5c at a falling edge. The output of the flip-flop 6 is used as a write clock signal (Write_Clock) of the flip-flop 1.

Next, the logic circuit according to this exemplary embodiment will be described by using a time chart shown in FIG. 4. Retiming of the write enable signal (Write_Enable) is performed at a rising edge of the Clock by the flip-flop 5c and an output (Write_Enable_1T) is outputted. After this operation, the retiming is performed at the falling edge of the Clock by the flip-flop 6 and it is used as the write clock signal (Write_Clock) of the flip-flop 1.

A condition at which the write to the flip-flop 1 can be enabled is as follows: only a case in which (1) the write enable signal (Write_Enable) is valid and (2) the write address (Write_Address) is valid (for example, the Address value of the setting circuit #1).

Only when the write enable signal (Write_Enable) is valid, the write clock signal (Write_Clock) outputted by the flip-flop 6 has a rising edge. For this reason, when the write enable signal (Write_Enable) is invalid (fixed to Low), the write clock signal (Write_Clock) has a fixed value (Low).

Even when the circuit configuration of the peripheral circuit of the flip-flop 1 is changed due to the soft error of the configuration RAM, a new value cannot be written to the flip-flop 1 when the write enable signal (Write_Enable) is not valid. Accordingly, the hold value of the flip-flop 1 does not change.

In this way, when both the following conditions (1) and (2) are satisfied, "A" in the write data (Write_Data) is written to the flip-flop 1 of the setting circuit #1.

(1) The write enable signal (Write_Enable) is valid.

(2) The write address (Write_Address) is valid (the Address value of the setting circuit #1).

Similarly, when the write enable signal (Write_Enable) is valid and the write address (Write_Address) is valid (the Address value of the setting circuit #2), "B" in the write data (Write_Data) is written to the flip-flop 1 of the setting circuit #2.

Similarly, when the write enable signal (Write_Enable) is valid and the write address (Write_Address) is valid (the Address value of the setting circuit #3), "C" in the write data (Write_Data) is written to the flip-flop 1 of the setting circuit #3.

By using the logic circuit according to this exemplary embodiment, the flip-flop 1 can keep the setting value that is initially set as the hold value without changing it. Even when the soft error occurs in the configuration RAM, the error occurring in the configuration RAM is corrected by the self-control error correction function of the FPGA, and the error is recovered, the flip-flop 1 can keep the setting value that is initially set as the hold value. Further, the circuit scale scarcely increases.

[Second Exemplary Embodiment]

Figure 5:
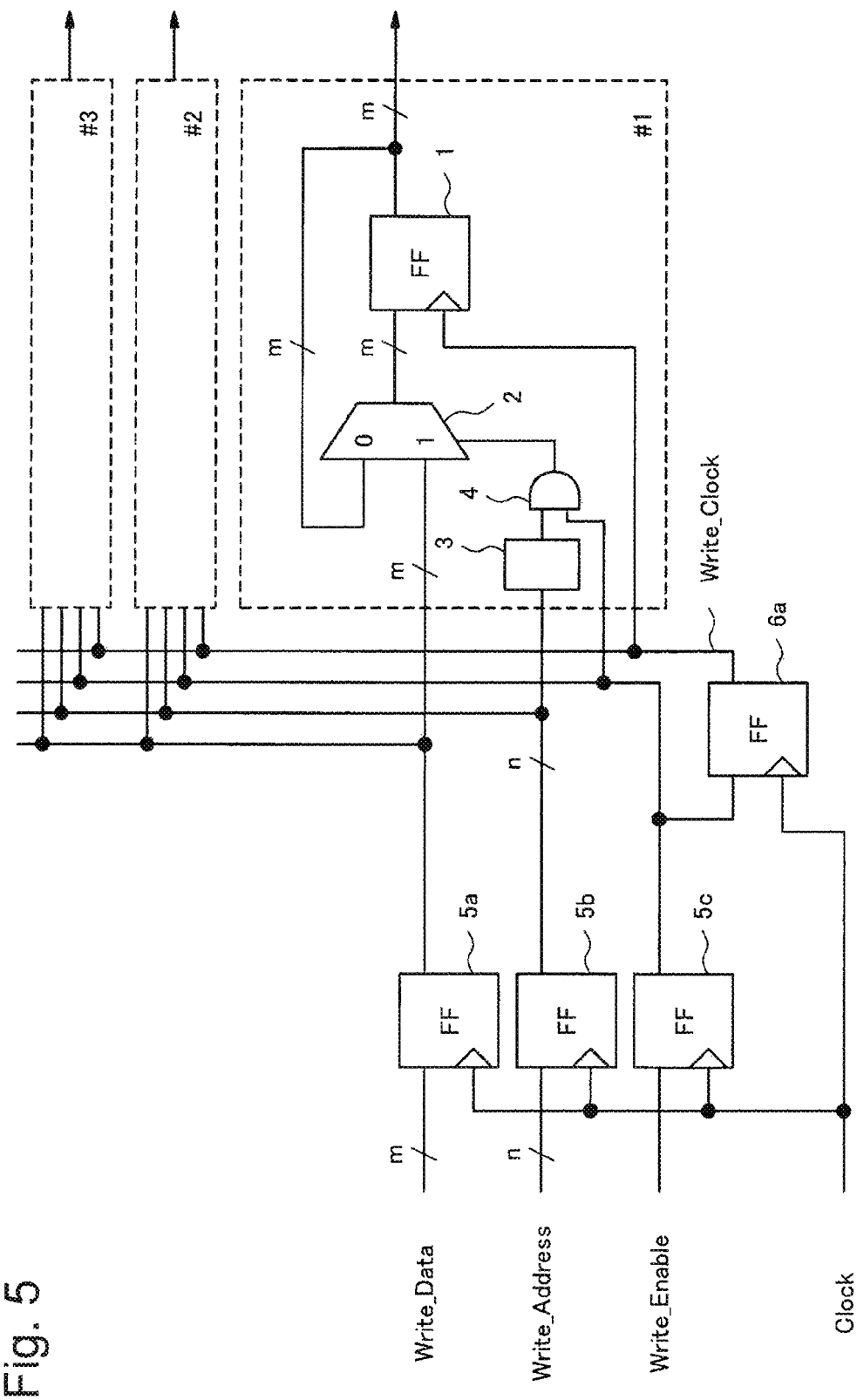
FIG. 5 is a block diagram showing a logic circuit according to a second exemplary embodiment of the present invention.
Figure 6:
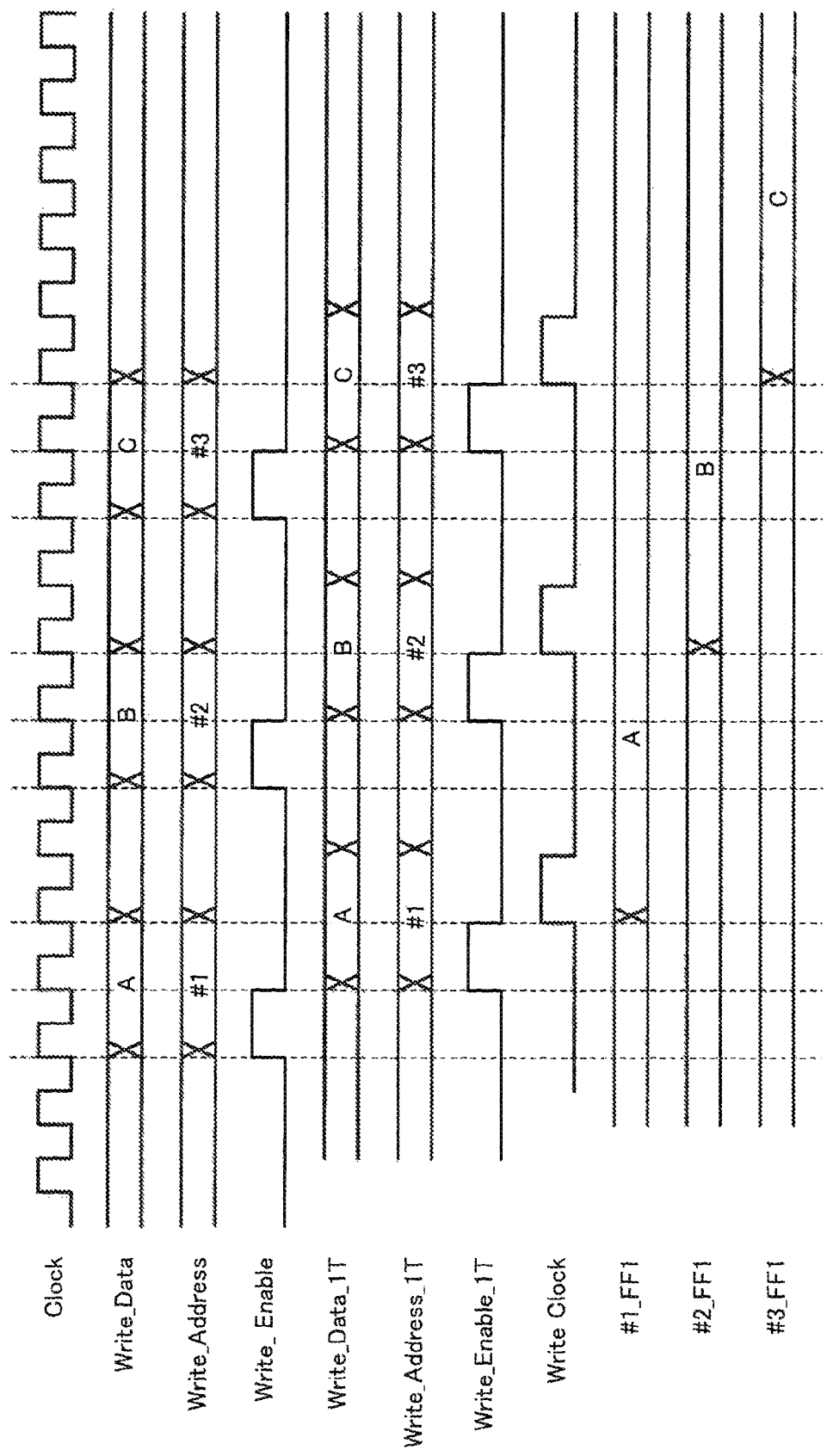
FIG. 6 is a time chart for explaining operation of a logic circuit shown in FIG. 5.

Next, a logic circuit according to a second exemplary embodiment of the present invention will be described. The second exemplary embodiment is a modification example of the first exemplary embodiment. The same reference numbers are used for the elements having the similar function as the first exemplary embodiment and the detail description of the element will be omitted. FIG. 5 is a block diagram showing the logic circuit according to the second exemplary embodiment of the present invention. FIG. 6 is a time chart for explaining operation of the logic circuit shown in FIG. 5.

A clock frequency becomes higher, the use of a reverse phase edge results in the decrease in design margin of an alternating current circuit. In this exemplary embodiment, a case in which the logic circuit is configured of only a positive phase flip-flop is shown as an example.

The logic circuit shown in FIG. 5 includes a flip-flop 5a, a flip-flop 5b, and a flip-flop 5c like the first exemplary embodiment. The logic circuit shown in FIG. 5 further includes a setting circuit and a flip-flop 6a. Further, the setting circuit which holds the setting information includes a flip-flop 1, a selector 2, an n-to-1 decoder 3, and a gate 4.

In this exemplary embodiment, the positive phase Clock is supplied to the flip-flop 5a, the flip-flop 5b, and the flip-flop 5c and the positive phase Clock is also supplied to the flip-flop 6a. In other word, an in-phase Clock is supplied to the flip-flop 5a, the flip-flop 5b, and the flip-flop 5c, as well as the flip-flop 6.

As shown in FIG. 6, retiming of the write enable signal (Write_Enable) is performed at the rising edge of the Clock by the flip-flop 5c and an output (Write_Enable_1T) is outputted. After this operation, retiming of this output signal is performed at the rising edge of the Clock by the flip-flop 6a and the output is used as the write clock signal (Write_Clock) of the flip-flop 1.

By using the logic circuit according to this exemplary embodiment, the flip-flop 1 can keep the setting value that is initially set as the hold value without changing it like the first exemplary embodiment. Even when the soft error occurs in the configuration RAM, the error occurring in the configuration RAM is corrected by the self-control error correction function of the FPGA, and the error is recovered, the flip-flop 1 can keep the setting value that is initially set as the hold value without changing it. Further, the circuit scale scarcely increases.

Further, in this exemplary embodiment, because the flip-flops 5a to 5c and 6a are configured of only the positive phase flip-flop, the decrease in design margin of an alternating current circuit can be prevented.

[Third Exemplary Embodiment]

Figure 7:
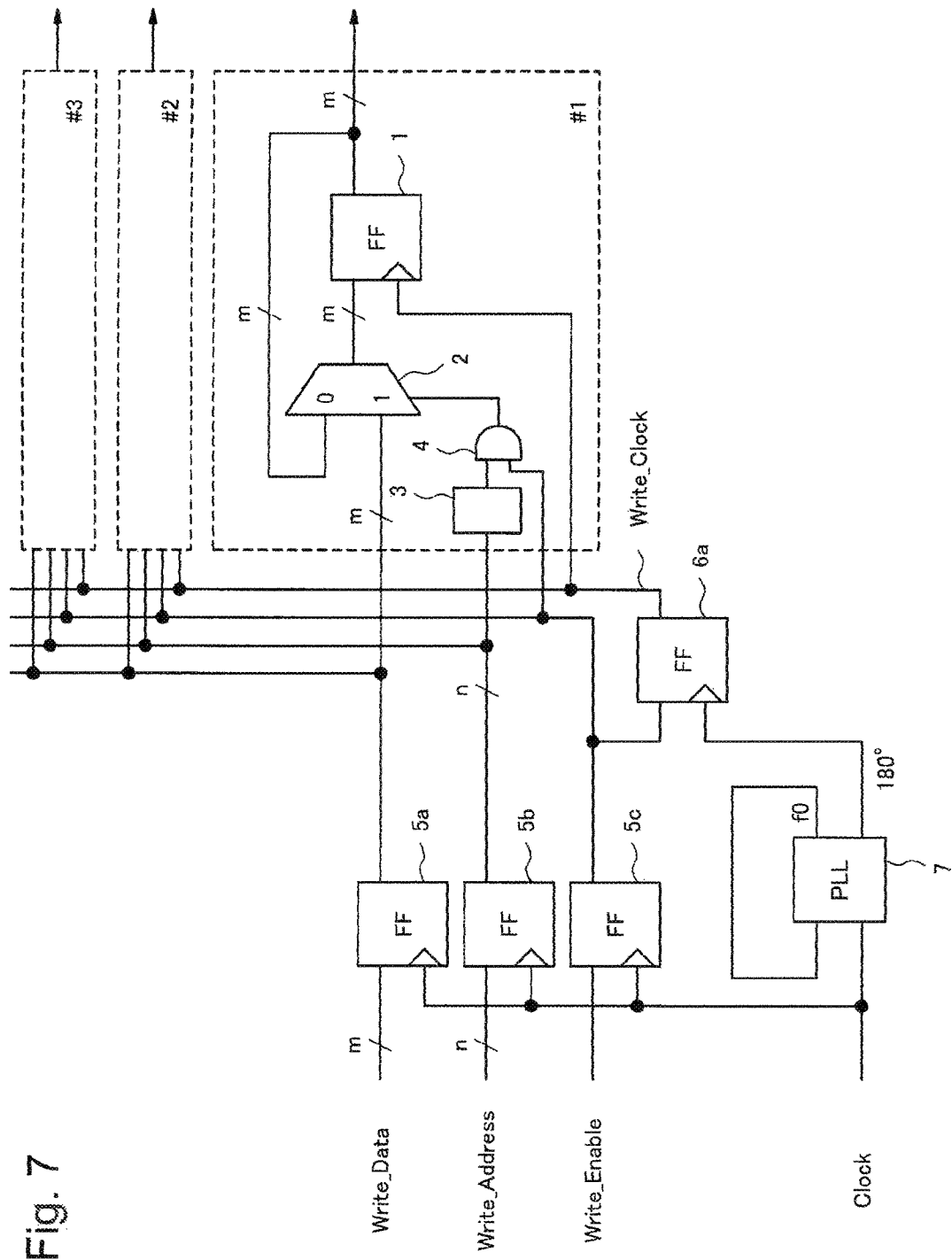
FIG. 7 is a block diagram showing a logic circuit according to a third exemplary embodiment of the present invention.

Next, the logic circuit according to a third exemplary embodiment of the present invention will be described. The third exemplary embodiment is a modification example of the first exemplary embodiment or the second exemplary embodiment. The same reference numbers are used for the elements having the similar function as the first and second exemplary embodiments and the detail description of the element will be omitted. FIG. 7 is a block diagram showing the logic circuit according to the third exemplary embodiment of the present invention. FIG. 8 is a time chart for explaining operation of the logic circuit shown in FIG. 7.

When the Clock whose Duty_Cycle is varied (in other words, the duty cycle is not equal to 50%) is used, the use of a reverse phase edge results in the decrease in design margin of an alternating current circuit. In order to solve this issue, in this exemplary embodiment, as an example, a PLL (Phase Locked Loop) circuit included in the FPGA is used.

The logic circuit shown in FIG. 7 includes a flip-flop 5a, a flip-flop 5b, a flip-flop 5c, and a flip-flop 6a like the second exemplary embodiment. The logic circuit shown in FIG. 7 further includes a setting circuit. Further, the setting circuit which holds the setting information includes the flip-flop 1, the selector 2, the n-to-1 decoder 3, and the gate 4.

Further, in this exemplary embodiment, a PLL 7 which generates a Clock whose phase is shifted by 180 degrees is further included. The PLL 7 generates a Clock (180 degrees_Clock) whose phase is shifted by 180 degrees from the phase of the Clock.

In this exemplary embodiment, the Clock is supplied to the flip-flop 5a, the flip-flop 5b, and the flip-flop 5c and the Clock (180 degrees_Clock) whose phase is shifted by 180 degrees is supplied to the flip-flop 6a. In other word, an in-phase Clock is supplied to the flip-flop 5a, the flip-flop 5b, and the flip-flop 5c, the Clock (180 degrees_Clock) whose phase is shifted by 180 degrees is supplied to the flip-flop 6a.

As shown in FIG. 8, retiming of the write enable signal (Write_Enable) is performed at the rising edge of the Clock by the flip-flop 5c and an output (Write_Enable_1T) is outputted. After this operation, retiming of this output signal is performed at the rising edge of the Clock (180 degrees_Clock) whose phase is shifted by 180 degrees by the flip-flop 6a and it is used as the write clock signal (Write_Clock) of the flip-flop 1.

By using this exemplary embodiment, like the logic circuit according to the first exemplary embodiment and the second exemplary embodiment, the flip-flop 1 can keep the setting value that is initially set as the hold value without changing it. Even when the soft error occurs in the configuration RAM, the error occurring in the configuration RAM is corrected by the self-control error correction function of the FPGA, and the error is recovered, the flip-flop 1 can keep the setting value that is initially set as the hold value without changing it. Further, the circuit scale scarcely increases.

Further, in this exemplary embodiment, the Clock (180 degrees_Clock) whose phase is shifted by 180 degrees is supplied to the flip-flop 6a and whereby, the flip-flops 5a to 5c and 6a are configured of only the positive phase flip-flop. By using this configuration, the decrease in design margin of an alternating current circuit can be prevented.

The invention of the present application has been described above with reference to the preferred exemplary embodiment of the present invention. However, the invention of the present application is not limited to the above mentioned exemplary embodiment. For example, in the third exemplary embodiment, the clock whose phase is shifted by an arbitrary amount other than 180 degrees can be used. Further, even when the PLL generates the clock with a frequency that is two or several times of the frequency used in the third exemplary embodiment, the above-mentioned operation can also be performed. Moreover, a positive phase clock signal in the exemplary embodiments may be in positive logic, and a reverse phase clock signal may be an inverted signal to the positive phase clock signal. Otherwise, a positive phase clock signal in the exemplary embodiments may be in negative logic, and a reverse phase clock signal may be an inverted signal to the positive phase clock signal.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

REFERENCE SIGNS LIST 1, 5a, 5b, 5c, 6, 6a flip-flop
2 selector
3 decoder
4 gate
7 PLL
10 setting circuit
11 fourth flip-flop
12 selector
14 gate circuit
15a first flip-flop
15b second flip-flop
15c third flip-flop
16 fifth flip-flop
20 FPGA
21 switch matrix section
22 wiring section
23 PLD section
24 configuration RAM

The invention claimed is:

1. A logic circuit, comprising:
a setting circuit which holds and outputs setting information;
a first flip-flop which holds data written to the setting circuit and outputs it in synchronization with an inputted clock;
a second flip-flop which holds a write address for selecting the setting circuit and outputs it in synchronization with the inputted clock; and
a third flip-flop which holds write enable which allows writing to the setting circuit and outputs it in synchronization with the inputted clock,
wherein the setting circuit includes a fourth flip-flop which holds the setting information in synchronization with a given timing signal, a selector which gives one of the output of the fourth flip-flop and the output of the first flip-flop to the input of the fourth flip-flop, and a gate circuit which controls a selection state of the selector on a basis of the output of the second flip-flop and the output of the third flip-flop, and
wherein the setting circuit further includes a fifth flip-flop which holds the output of the third flip-flop and outputs a write clock to the fourth flip-flop as the timing signal in synchronization with the inputted clock.

2. The logic circuit according to claim 1, wherein an in-phase clock is inputted to the first to third flip-flops and a reverse phase clock is inputted to the fifth flip-flop.

3. The logic circuit according to claim 2, wherein the fifth flip-flop outputs the write clock in synchronization with a falling edge of the clock.

4. The logic circuit according to claim 1, wherein an in-phase clock is inputted to the first to third flip-flops and a phase shifted clock is inputted to the fifth flip-flop.

5. The logic circuit according to claim 4, wherein a clock whose phase is shifted by 180 degrees is inputted to the fifth flip-flop.

6. The logic circuit according to claim 5, wherein the fifth flip-flop outputs the write clock in synchronization with the rising edge of the clock.

7. The logic circuit according to claim 4, wherein the fifth flip-flop outputs the write clock in synchronization with a rising edge of the clock.

8. The logic circuit according to claim 1, further including a PLL (Phase Locked Loop) which generates a timing signal sent to the fifth flip-flop from the inputted clock.

9. A programmable logic circuit comprising the logic circuit according to claim 1, a wiring section which includes a plurality of wirings, a switch matrix section which determines a connection of a plurality of the wirings in the wiring section, and a PLD (Programmable Logic Device) section which is connected to the wiring section and includes a programmable logic element.

10. The programmable logic circuit according to claim 9, further comprising a configuration RAM (Configuration Random Access Memory) which instructs the switch matrix section to make the connection or not to make the connection with respect to a plurality of the wirings in the wiring section.

11. A method for controlling a setting circuit which holds setting information used in a logic circuit comprising the setting circuit, a first flip-flop, a second flip-flop, and a third flip-flop,
wherein the first flip-flop holds data written to the setting circuit and outputs it,
wherein the second flip-flop holds a write address signal for selecting the setting circuit and outputs it,
wherein the third flip-flop holds write enable signal which allows writing to the setting circuit and outputs it,
wherein the setting circuit includes a fourth flip-flop which holds the setting information in synchronization with a given timing signal, a selector which gives one of the output of the fourth flip-flop and the output of the first flip-flop to the input of the fourth flip-flop, and a gate circuit which controls a selection state of the selector on a basis of the output of the second flip-flop and the output of the third flip-flop, wherein the setting circuit further includes a fifth flip-flop which holds the output of the third flip-flop and outputs a write clock to the fourth flip-flop as the timing signal, and wherein, only when the write enable signal is valid and the write address signal is valid, writing to the setting circuit is enabled.

\* \* \* \* \*